United States Patent [19]

Tanazawa

[11] Patent Number: 4,545,119

[45] Date of Patent: Oct. 8, 1985

[54] METHOD OF MANUFACTURING A PRINTED CIRCUIT BOARD

[76] Inventor: Hisaji Tanazawa, 8-4, Hanazonohigashimachi 1-chome, Higashiosaka-shi, Osaka, Japan

[21] Appl. No.: 457,684

[22] Filed: Jan. 13, 1983

[30] Foreign Application Priority Data

Jan. 14, 1982 [JP] Japan .................. 57-4144[U]

[51] Int. Cl.[4] .............................. H05K 3/34
[52] U.S. Cl. ............................ 29/839; 29/838; 174/68.5; 228/110; 427/98
[58] Field of Search .................. 29/876, 838, 839; 174/68.5; 339/275 B; 228/1 R, 110; 427/98; 156/668

[56] References Cited

U.S. PATENT DOCUMENTS

| Re. 15,364 | 5/1922 | Rypinski | 29/839 X |
|---|---|---|---|
| 2,958,926 | 11/1960 | Morison | 29/838 |
| 3,264,524 | 8/1966 | Dahlgren | 174/68.5 |
| 3,334,395 | 8/1967 | Cook et al. | |
| 3,380,150 | 4/1968 | Daniels | 228/110 |
| 3,436,005 | 4/1969 | Van Der Burgt | 228/1 |
| 3,446,908 | 5/1969 | Tally et al. | 174/68.5 |
| 3,698,075 | 10/1972 | Boyle | 228/110 |
| 4,015,328 | 4/1977 | McDonough | 29/839 X |
| 4,027,370 | 6/1977 | Bachar | 228/1 R X |
| 4,088,257 | 5/1978 | Devine | 228/110 |
| 4,327,126 | 4/1982 | Ogden | 427/98 X |
| 4,389,268 | 6/1983 | Oshima et al. | 427/98 X |
| 4,433,009 | 2/1984 | Henze et al. | 156/668 X |

FOREIGN PATENT DOCUMENTS

| 52-36756 | 3/1977 | Japan. | |
| 56-67121 | 6/1981 | Japan | 29/882 |

Primary Examiner—Howard N. Goldberg
Assistant Examiner—Carl J. Arbes
Attorney, Agent, or Firm—Armstrong, Nikaido, Marmelstein & Kubovcik

[57] ABSTRACT

Printed circuit board, provided with conductive pattern on one side or both sides of the board and through-holes, has conductive materials being inserted in its through-holes, the conductive material being metallically connected with the conductive pattern.

The printed circuit board is manufactured in such a manner that by inserting conductive material to the through-hole, bending end portion of the conductive material laterally toward conductive pattern, applying ultrasonic welding to the bent end portion of the conductive pattern so as to make the end portion metallically connected to the conductive pattern.

9 Claims, 5 Drawing Figures

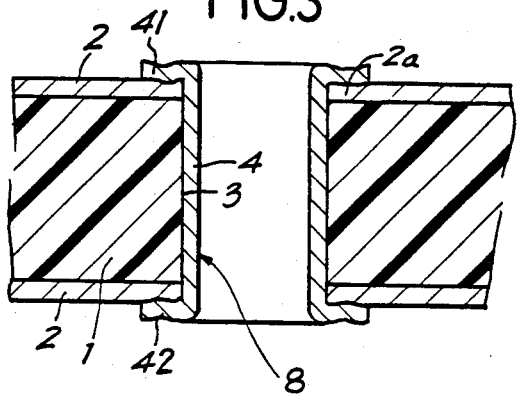
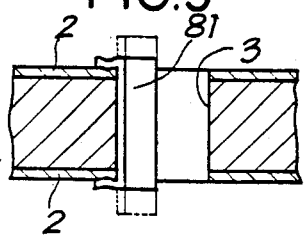
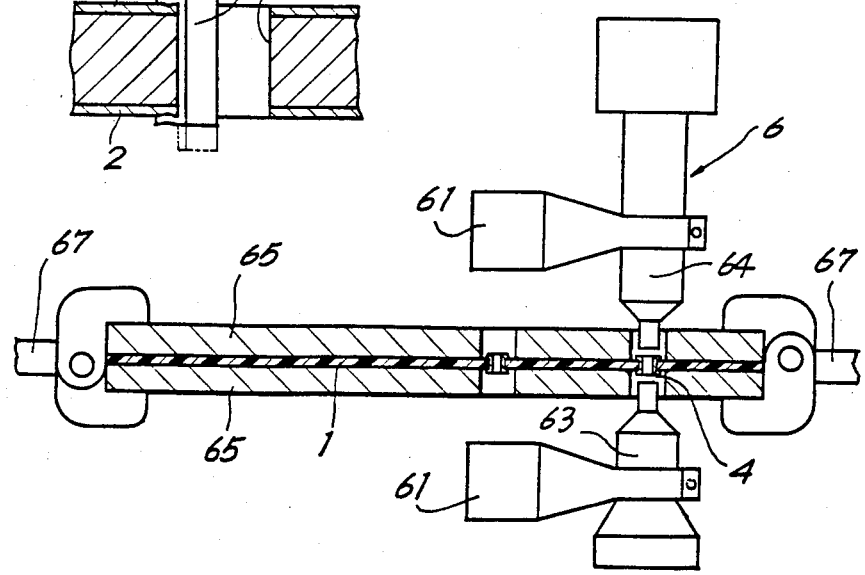

METHOD OF MANUFACTURING A PRINTED CIRCUIT BOARD

BACKGROUND OF THE INVENTION

The present invention relates to a printed circuit board and a manufacturing method thereof wherein conductive material such as eyelet is inserted to the through-holes and caulked in order to connect the material with the electric circuit pattern which is printed on one or both sides of the board.

In the conventional printed board, through-hole are provided with conductive materials on their inner surface which are connected to the conductive pattern so as to assure the electric connection of the electric elements on mounting the parts on the board.

For the method of forming a conductive material on the inner surface of the through-hole of the board, various methods are applicable for this purpose, such as a method of applying plating on the through hole, a method of filling a conductive paint like a silver paste in the through-hole, and a method of fitting an eyelet to the hole.

The methods as above-mentioned have both advantages and disadvantages. The method of applying plating has a high reliability of conduction. But it is very high in cost, because so many processes and long working time are involved. Besides, an expensive installation is required for purifying waste water having generated in the plating process.

The method of applying a conductive paint is more economical in cost than plating. In this case, however, the electric resistance value is generrly large besides that it produces air bubbles or cracks in the paint layer, and for this reason the reliability as to electric conduction is low. Also it accompanies deterioration of products due to the heating which was incurred during the process.

In the method of using an eyelet, electric conduction is unstable because, as shown in FIG. 2, the flanges 41 and 42 of an eyelet 4 merely overlap on the conductive pattern 2 and 2, making no metallic connection with the conductive patterns. To improve the electric conduction, an applied pressure in caulking has only to be raised so that the flange will penetrate into the conductive pattern to obtain much closer contact with the conductive pattern. This can not be done, however, because the printed circuit board is sure to be damaged, being vulnerable to a higher pressure. For this reason, the eyelet is rarely used these days, notwithstanding its excellent advantages of low price and fitness to mass production.

SUMMARY OF THE INVENTION

The present invention has settled the conflicting problem that a high caulking pressure, if applied, will break the load, while a low caulking pressure will cause a poor contact of the flange with the conductive pattern, resulting in an unstable electric conduction, and suceeded in enhancing the electric conduction between the eyelet and the conductive pattern without spoiling the advantages of low cost and fitness to mass production of the eyelet.

The object of the present invention is to provide a printed circuit board wherein conductive material such as eyelet, wire, foil, and the conductive patterns are electrically conducted reliably by applying an ultrasonic welding to a conductive material inserted into a through-hole in the printed board.

Another object of the invention is to provide a method of manufacturing the printed circuit board wherein the conductive material and the conductive patterns are connected reliably by applying ultrasonic welding to the conductive material which is applied to the through-hole in the printed board.

BRIEF DESCRIPTION OF THE DRAWINGS

FIG. 3 is a cross-sectional view of an eyelet and the conductive pattern being metallically connected, FIG. 4 is a schematic view of an ultrasonic welding apparatus, and FIG. 5 is a cross-sectional view showing another embodiment of the invention.

DETAILED DESCRIPTION OF A PREFERRED EMBODIMENT

Figure 1:
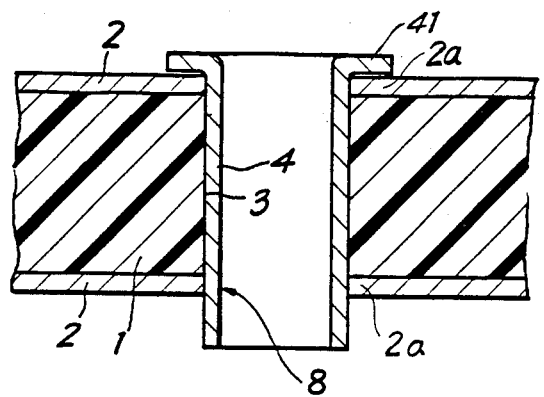
FIG. 1 is a cross-sectional view of an eyelet being inserted into a printed board.
Figure 2:
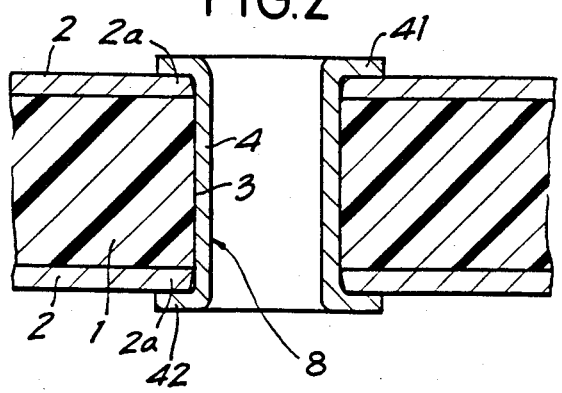
FIG. 2 is a cross-sectional view of an eyelet being caulked on the board, this being also a prior art.

The present invention will be fully explained refering to the drawings showing embodiment of the invention as an exemplified piece for conductive material, eyelet, is mentioned in the following explanation.

A printed circuit board 1 is made by a laminated insulation board impregnated with epoxy or phenolic resin. The board 1 is provided with conductive patterns 2 and 2 made of copper foil of approximately 35 $\mu$m thickness on both sides, and a through hole 3 is provided at lands 2a and 2a of the above-mentioned patterns.

An eyelet 4 is inserted into the above-mentioned through hole by means of manual operation or automatic machine, and then caulked thereto, letting the flanges 42 and 42 overlap on the lands 2a and 2a. The eyelet 4 employed in the present embodiment is of cylindrical shape with its outer diameter being approximately 1 mm, the diameter of both flanges 41 and 42 being approximately 1.5 mm. The eyelet 4 is preferably of the same material with the conductive pattern 2 and the thickness thereof is suitably 10–100 $\mu$m. When the thickness of eyelet comes in less than 10 $\mu$m, the eyelet itself is difficult to be made, and when the thickness exceeds 100 $\mu$m, the eyelet is unsuitable because of an increase in the amount of energy required for joining it to the conductive pattern by means of ultrasonic welding. Other than the eyelet made of copper, those made of aluminum, brass or the like are commercially available for use. Those made of soft materials are preferable for the eyelet. And an annealed eyelet is convenient for caulking and ultrasonic welding.

Subsequently, the eyelet 4 is joined by means of ultrasonic welding.

As shown in FIG. 4, the above-mentioned board 1 is pinched between two holding plates 65 and 65 made of iron or fixed directly by a vice 67, and also the eyelet 4 on the board 1 is positioned between electrodes 63 and 64 of an ultrasonic welding apparatus 6. On the surfaces of the sonic electrode 63 and the reflection electrode 64, which are facing each other on the opposite sides of the board, fine indent is formed to prevent a slip between the flanges 41 and 42 and lands 2a. While pinching and pressing the eyelet 4 with the sonic electrode 63 and reflection electrode 64, vibration is delivered to either sonic electrode 63 or the reflection electrode 64 by means of a vibrator 61, and subsequently the other electrode is caused to vibrate and thereby causing the flanges 41 and 42 of the eyelet 4 and the conductive patterns 2 and 2 to be metallically connected.

When the conductive pattern is provided only on one side of the board, it is needless to say that the ultrasonic welding has only to be applied between the pattern and the flange in contact with the pattern.

The pressure for clamping the eyelet 4 by means of the sonic electrode 63 and the reflection electrode 64 has only to be not less than the pressure required for fixing the flanges 41 and 42 of the eyelet 4 to the conductive patterns and not more than 500 kg/cm$^2$. An excessively weak pressure applied to the eyelet will reduce the reliability of metallic connection between the conductive pattern and the eyelet. At the same time, applied pressure exceeding 500 kg/cm$^2$ will break the board 1 at the hole edge or at the flange portion of the eyelet resulting in a poor reliability of electric conduction. Furthermore, the board itself will also break down.

In the case of the eyelet in the present embodiment, an applied pressure of not more than 300 kg/cm$^2$ is preferable and not more than 100 kg/cm$^2$ is more preferable.

And the frequency of ultrasonic vibration is to be set to 15–80 kHz.

When the frequency is less than 15 kHz, a metallic connection is difficult to be obtained, and when the frequency exceeds 80 kHz, the area whereto the pressure is applied becomes smaller, and therefore the inner diameter of the eyelet has to be reduced, resulting in an inconvenience in inserting a terminal of an electronic part. Moreover, the fabrication of the vibrator becomes difficult. In the case of the eyelet in the present embodiment, 20–60 kHz is more preferable, and 25–35 kHz is even more preferable.

And it is noted that the amplitude of the ultrasonic vibration is preferably 0.5–100 $\mu$m when the amplitude exceeds 100 $\mu$m, the eyelet 4 and the conductive pattern 2 are liable to break down. When the amplitude is 0.5 $\mu$m or less, the frequency is increased as a matter of course, and this is undesirable for the reason above described.

In the case of the present embodiment, the amplitude of 1–50 $\mu$m is more preferable and 10–40 $\mu$m is most desirable.

As to the degree of metallic connection, mere connection which ensures stable electric conduction is sufficient, and the strength which is usually required at the ordinary welding is not necessary at all in the present invention, the strength connecting the flange of the eyelet with the conductive pattern at each through-hole may be as much as 500 grams to 10 kg. Whereas in the ordinary welding in the various industries the strength of welded part should be as strong as other basic material, to be broken at basic material other than the welded part in tensile strength test. Accordingly, not the whole part of respective flanges of 41 and 42 of the eyelet 4 are required to be metallically connected to the conductive pattern 2, but a reliable partial connection at flanges and pattern is sufficient to serve the purpose.

Furthermore, when the flanges 41 and 42 of the eyelet 4 are metallically connected in part to the conductive patterns 2 and 2, fixing of the eyelet 4 and the conductive patterns 2 and 2 can be made sufficiently by inserting a lead wire of an electronic element (not illustrated) into the hole of the eyelet 4 and is soldered thereto.

The diameter of the flanges 41 and 42 of the eyelet 4 is designed to be smaller than the land 2a of the conductive pattern 2. This is because wetting of solder can be made nicely in soldering the terminal of an electronic element to the eyelet 4 as mentioned above.

And, if a solderable metal coating such as a solder coating or the like is formed on the surface of the eyelet coating in a thickness of 0.5–50 $\mu$m in advance by means of the dip soldering or by plating, soldering of the lead wire of the electronic element to the eyelet can be made more effectively.

In performing the ultrasonic welding between the eyelet and the conductive pattern, no hindrance takes place even when a soldering layer is placed between them as mentioned above, because the solder layer is expelled out of the contact surface of the flange 41 and the conductive pattern 2 together with impurities on the metal surface by the local pressure and friction heat in the ultrasonic welding.

Furthermore, as is well known, the ultrasonic welding can dispense with the surface preparation for welding which helps to shorten the required time extremely for the ultrasonic welding of the eyelet 4 to the board 1, resulting in an efficient production.

When a solder layer is formed by the dip soldering method, an advantage is obtainable in that the eyelet is annealed and softened simultaneously in this step.

In case when the metallic connections were made between the brass eyelets and the conductive pattern at a hundred locations by the method in accordance with the present invention, the electric resistance between the eyelet and the conductive pattern had scarcely any scattered effect in value, showing the values at 3–4 m$\Omega$. This is by far better in comparison with the conventional electric connection made between the silver paste conductor and the conductive pattern, whose electric resistance value is 12 to 20 m$\Omega$, with very wide scattering in value.

As mentioned above, the technique of caulking the eyelet to the through-hole of the printed board is simple and economical, while it has a fatal disadvantage with a printed circuit board in that the electric conduction is unstable. However, this disadvantage has been settled completely by the metallic connection between the eyelet of the flange and the conductive pattern by means of the ultrasonic welding.

In the method in accordance with the present invention, no thermal influence affects at all to the board by the ultrasonic welding and no great pressure is required to be applied, enabling the conductive patterns and the flanges of the eyelet to be metallically connected on the printed circuit board made of resin which is of very weak durability against application of heat and pressure.

EXAMPLE

For the practice of the present invention, paper laminates impregnated with phenolic resin hacing copper foil of 35 $\mu$m on both surfaces was used as a printed circuit board. The eyelets being inserted to the through-holes and caulked were made with copper having thickness of 35 $\mu$m.

Ultrasonic welding was performed to the eyelets applying pressure of 10 kg/cm$^2$ with amplitude of 23 $\mu$m.

It was revealed that the electric resistance between the flange of the eyelet and the conductive pattern was only 4 mΩ, which is an evidence that the eyelet was connected metallically with the conductive pattern.

In other embodiment of the present invention, the eyelet shall be substituted with metallic wire or metal foil 81 as shown in FIG. 5. Both end portions of the metallic foil which are projecting from the through-holes bent laterally toward conductive pattern 2. The bent end portions of the metallic foil 81 are ultrasonic welded to connect the end portions of the foil metallically with the conductive pattern 2 on the board.

In the printed circuit board obtained in accordance with the present invention, the connection has a small scatter in electric resistance value and a high reliability and occurance of defective products can be reduced to an extremely low level even when a product is completed by loading electronic elements, and thereby assuring the present printed circuit board to demonstrate an excellent advantage which cannot be expected in the case of conventional printed circuit boards.

It is needless to say that the present invention is not limited to the description of the above and the illustration of the attached drawings, and that various modification can be made from the description and drawings without departing from the spirit of the invention.

What is claimed is:

1. A method of manufacturing a printed circuit board of paper laminates impregnated with epoxy or phenolic resin having conductive patterns provided on both sides thereof and through-holes to receive electronic elements characterized by inserting conductive materials to the through-holes, bending projecting end portion of the conductive materials laterally toward conductive patterns, holding the bent end portion of the conductive material by pinching it with an ultrasonic tool at both front and rear sides of said printed board, and applying ultrasonic vibration to the contacting surface of the bent end portion of the conductive material and conductive pattern with a pressure not less than that required for fixing the end portion to said conductive patterns and not more than 500 kg/cm$^2$ rendering metallic contact between them, the frequency of the ultrasonic vibration being 15-80 kHz and the amplitude being 0.5-100 um.

2. Method of manufacturing a printed circuit board as defined in claim 1, wherein the frequency of ultrasonic vibration is 20-60 kHZ and the amplitude thereof is 1-50 μm.

3. Method of manufacturing a printed circuit board as defined in claim 1 wherein the frequency of ultrasonic vibration is 25-35 kHz and the amplitude thereof is 10-40 μm.

4. Method of manufacturing a printed circuit board as defined in claim 1 wherein the conductive material is an eyelet, and one of end portions of the eyelet is expanded laterally by caulking.

5. Method of manufacturing a printed circuit board as defined in claim 1 wherein the conductive material is an metallic wire.

6. Method of manufacturing a printed circuit board as defined in claim 1 wherein the conductive material is a metallic foil.

7. Method of manufacturing a printed circuit board as defined in claim 4 wherein the material of an eyelet and conductive patterns are copper and thickness of the eyelet is 10-100 μm.

8. Method of manufacturing a printed circuit board as defined in claim 4 wherein the material of an eyelet is annealed copper.

9. Method of manufacturidng a printed circuit board as defined in claim 4 wherein a solderable metal coating is provided on the surface of an eyelet's main body.

* * * * *